(12) United States Patent
Nakazawa et al.

(10) Patent No.: US 12,083,563 B2
(45) Date of Patent: Sep. 10, 2024

(54) SUBSTRATE TREATING APPARATUS

(71) Applicant: SCREEN Holdings Co., Ltd., Kyoto (JP)

(72) Inventors: Kazuhiko Nakazawa, Kyoto (JP); Yuichi Takayama, Kyoto (JP); Toshihito Morioka, Kyoto (JP); Hiromichi Kaba, Kyoto (JP); Takuya Sato, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 908 days.

(21) Appl. No.: 17/016,438

(22) Filed: Sep. 10, 2020

(65) Prior Publication Data

US 2021/0086236 A1 Mar. 25, 2021

(30) Foreign Application Priority Data

Sep. 20, 2019 (JP) ................... 2019-171517

(51) Int. Cl.
| | |
|---|---|
| *B08B 3/04* | (2006.01) |
| *B08B 3/08* | (2006.01) |
| *B08B 3/10* | (2006.01) |
| *B08B 5/02* | (2006.01) |
| *B08B 13/00* | (2006.01) |
| *H01L 21/67* | (2006.01) |

(Continued)

(52) U.S. Cl.
CPC ............... *B08B 3/041* (2013.01); *B08B 3/08* (2013.01); *B08B 3/10* (2013.01); *B08B 5/023* (2013.01); *B08B 13/00* (2013.01); *H01L 21/67051* (2013.01); *H01L 21/6838* (2013.01); *H01L 21/68742* (2013.01); *H01L 21/68764* (2013.01)

(58) Field of Classification Search
CPC ................................. H01L 21/68742
See application file for complete search history.

(56) References Cited

U.S. PATENT DOCUMENTS

| | | | |
|---|---|---|---|
| 6,306,455 B1 | 10/2001 | Takamori et al. | ................ 427/8 |
| 10,410,887 B2 | 9/2019 | Nakano | |

(Continued)

FOREIGN PATENT DOCUMENTS

| | | |
|---|---|---|
| CN | 1674247 A | 9/2005 |
| JP | H07-263324 A | 10/1995 |

(Continued)

OTHER PUBLICATIONS

JP2019046985—Machine Translation (Year: 2019).*

(Continued)

*Primary Examiner* — Marc Lorenzi
(74) *Attorney, Agent, or Firm* — OSTROLENK FABER LLP

(57) ABSTRACT

Disclosed is a substrate treating apparatus for treating a substrate with a treating liquid, the apparatus including the following: a rotating member including a plurality of through-holes formed therein; a plurality of support pins attached to the through-holes with a non-sealing structure, and configured to support a substrate in such a manner that the substrate is spaced apart; a supply nozzle configured to supply a treating liquid to the substrate; a cover spaced apart below the rotating member; a rotational drive device configured to drive the rotating member rotationally in a horizontal plane; and a drive device configured to drive the support pins.

8 Claims, 5 Drawing Sheets

(51) Int. Cl.
*H01L 21/683* (2006.01)
*H01L 21/687* (2006.01)

(56) References Cited

U.S. PATENT DOCUMENTS

| | | | |
|---|---|---|---|
| 2005/0139228 A1 | 6/2005 | Wilk et al. ........................ 134/1 |
| 2005/0215073 A1 | 9/2005 | Nakamura et al. ............ 438/778 |
| 2005/0253285 A1 | 11/2005 | Kuibira et al. ................ 257/787 |
| 2009/0101181 A1 | 4/2009 | Morisawa et al. ............ 134/94.1 |
| 2011/0222038 A1 | 9/2011 | Yamashita ...................... 355/53 |
| 2013/0233361 A1* | 9/2013 | Egashira ........... H01L 21/67051 134/153 |
| 2016/0236239 A1 | 8/2016 | Nishiyama |
| 2017/0358480 A1* | 12/2017 | Zhang ................. H01L 21/6875 |
| 2018/0226277 A1* | 8/2018 | Wakiyama ........ H01L 21/68792 |
| 2019/0252214 A1 | 8/2019 | Okita et al. |

FOREIGN PATENT DOCUMENTS

| | | |
|---|---|---|
| JP | H11-102882 A | 4/1999 |
| JP | 2001-308162 A | 11/2001 |
| JP | 2002-086048 A | 3/2002 |
| JP | 2002-313892 A | 10/2002 |
| JP | 2005-019701 A | 1/2005 |
| JP | 2005-135940 A | 5/2005 |
| JP | 2005-260088 A | 9/2005 |
| JP | 2008-130948 A | 6/2008 |
| JP | 2009-117794 A | 5/2009 |
| JP | 2010-073751 A | 4/2010 |
| JP | 2010-080583 A | 4/2010 |
| JP | 2013-105867 A | 5/2013 |
| JP | 2016-149420 A | 8/2016 |
| JP | 2018-067683 A | 4/2018 |
| JP | 2018-107388 A | 7/2018 |
| JP | 2019-046985 A | 3/2019 |
| KR | 10-2009-0039629 A | 4/2009 |
| KR | 10-2011-0039495 A | 4/2011 |
| TW | 201705250 A | 2/2017 |
| TW | 201935594 A | 9/2019 |

OTHER PUBLICATIONS

Office Action dated Dec. 16, 2021 for corresponding Korean Patent Application No. 10-2020-0110974.
Office Action dated Apr. 16, 2021 for corresponding Taiwan Patent Application No. 109128498.
Japanese Notice of Allowance dated Oct. 3, 2023 for corresponding Japanese Patent Application No. 2019-171517.
Notice of Allowance dated Jan. 31, 2024 for corresponding Chinese Patent Application No. 202010848063.8.

* cited by examiner

SUBSTRATE TREATING APPARATUS

BACKGROUND OF THE INVENTION

Field of the Invention

The present invention relates to a substrate treating apparatus for performing a treatment with a treating liquid on a substrate, such as a semiconductor wafer, a substrate for a liquid crystal display or for an organic electroluminescence (EL) display device, a glass substrate for photomask, a substrate for an optical disk, a substrate for a magnetic disk, a ceramic substrate, a substrate for a solar cell substrate, or the like (hereinafter, simply referred to as a substrate).

Description of the Related Art

Such currently-used types of devices include one having a platform, a plurality of support pins, and a supply nozzle. See, for example, Japanese Unexamined Patent Application Publication No. 2019-46985A (FIG. 6). The platform rotatably supports a substrate. The support pins are erected on an outer peripheral portion of an upper surface of the platform. The support pins support an outer peripheral edge of a substrate. The supply nozzle supplies a treating liquid to a substrate supported by the platform.

The support pins are inserted into through-holes formed in the platform. The support pins include lifting pins. The lifting pins each move upward/downward between a transfer position apart from the upper surface of the platform and a holding position closer to the upper surface of the platform than the transfer position. The treating liquid is supplied from the supply nozzle to the platform while the substrate is held thereon. The treating liquid flowing down to the platform enters inside the platform through the gaps between the support pins and the through-holes. Then, drive components for lifting/lowering the support pins may be damaged by the treating liquid. Accordingly, a sealing member such as an O-ring is attached to each of the through-holes of the platform in which the support pins are inserted.

SUMMARY OF THE INVENTION

However, the conventional example with such a configuration as above possesses the following drawbacks.

That is, in the currently-used apparatus, the support pin has extremely high sliding resistance against the sealing member. Therefore, the drive components driving the support pins need to produce a larger driving force. The number of the drive components for driving the support pins need to be increased. Moreover, enhanced strength of a connecting member moved upward/downward by the drive component is needed by connecting the plurality of support pins. This causes prevention of a reduction in cost of the substrate treating apparatus.

The present disclosure has been made regarding the state of the art noted above, and its one object is to provide a substrate treating apparatus that enables a reduction in cost by making support pins with a non-sealing structure.

The present invention is constituted as stated below to achieve the above object.

One aspect of the present invention provides a substrate treating apparatus for treating a substrate with a treating liquid. The substrate treating apparatus includes a rotating member resistant to the treating liquid, having a diameter larger than a diameter of a substrate, and including a plurality of through-holes formed therein and configured to be in communication with an upper surface and a lower surface thereof on an outer peripheral side; a plurality of support pins resistant to the treating liquid, attached to the through-holes with a non-sealing structure, and configured to support a substrate in such a manner that a lower surface of the substrate is spaced apart from the upper surface of the rotating member; a supply nozzle configured to supply a treating liquid to the substrate supported by the support pins on the upper surface of the rotating member; a cover resistant to the treating liquid and spaced apart below from the lower surface of the rotating member; a rotational drive device disposed within the cover and configured to drive the rotating member rotationally in a horizontal plane; and a drive device disposed within the cover and configured to drive the support pins.

According to the present invention, the support pins are attached to the through-holes of the rotating member with a non-sealing structure. Accordingly, the treating liquid supplied from the supply nozzle enters the lower surface of the rotation member through the gaps between the through-holes of the rotating member and the plurality of support pins. However, areas above the cover are resistant to the treating liquid, and the rotational drive device and the drive device are covered with the cover, leading to prevention of adverse effects by the treating liquid. Moreover, the non-sealing structure can lower sliding resistance and drive load. Consequently, the drive member does not need to increase the driving force and rigidity of the member for driving, leading to a reduction in cost of the substrate treating apparatus.

Moreover, it is preferable in the present invention that some of the support pins work as lifting pins, the substrate treating apparatus includes a connecting member configured to connect the lifting pins below the rotating member, and the drive device drives to lift and lower the lifting pins via the connecting member between a transfer position where the substrate is transported and a support position lower than the transfer position.

The drive device lifts and lowers the lifting pins via the connecting member. However, since the drive load is small due to the non-sealing structure, the rigidity of the connecting member can be lower than that of the currently-used connecting member.

Moreover, it is also preferable in the present invention that the drive device includes an actuation shaft configured to move forward and backward, an upper end of the actuation shaft abuts against the connecting member when the connecting member moves to the transfer position, the upper end of the actuation shaft is spaced apart from the connecting member when the connecting member moves to the support position, and the substrate treating apparatus includes magnets for attracting the connecting member downward with a magnetic force thereof when the connecting member moves from the transfer position to the support position.

The actuation shaft pushes the connecting member upward when the connecting member moves to the transfer position, and the actuation shaft is spaced apart from the connecting member when the connecting member moves to the support position. Accordingly, the support pins and the connecting member move downward by their own weights. At that time, the connecting member is attracted downward by the magnets. Consequently, the connecting member can move quickly from the transfer position to the support position.

Moreover, it is also preferable in the present invention that the rotating member includes a peripheral surface member extending downward from an outer peripheral surface of the rotating member, and including a lower end portion spaced apart upward from an upper surface of the cover, and an opened lower surface.

The treating liquid that entered below the rotation member through the through-holes of the rotating member can be prevented from scattering laterally. Moreover, since the lower surface of the peripheral surface member is open, the rotating member can be maintained easily.

Moreover, it is also preferable in the present invention that the substrate treating apparatus further includes a cleaning nozzle configured to supply a cleaning liquid toward an inside of the peripheral surface member.

The cleaning nozzle supplies the cleaning liquid to remove a treating liquid that has entered a lower part of the rotating member. This achieves cleaning within a space formed by the lower surface of the rotating member and the inside of the peripheral surface member can be cleaned.

Moreover, it is preferable in the present invention that the substrate treating apparatus further includes a gas supply mechanism configured to supply gas between the rotation member and a lower surface of a substrate supported by the support pins, and a suction force is generated on the substrate supported by the support pins toward the rotating member.

The gas supply mechanism supplies gas, thereby working as a Bernoulli chuck. Consequently, in addition to a holding force by the plurality of support pins, the suction force toward the rotating member can hold a substrate reliably.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DESCRIPTION OF THE PREFERRED EMBODIMENTS

The following describes one embodiment of the present invention with reference to drawings.

Figure 1:
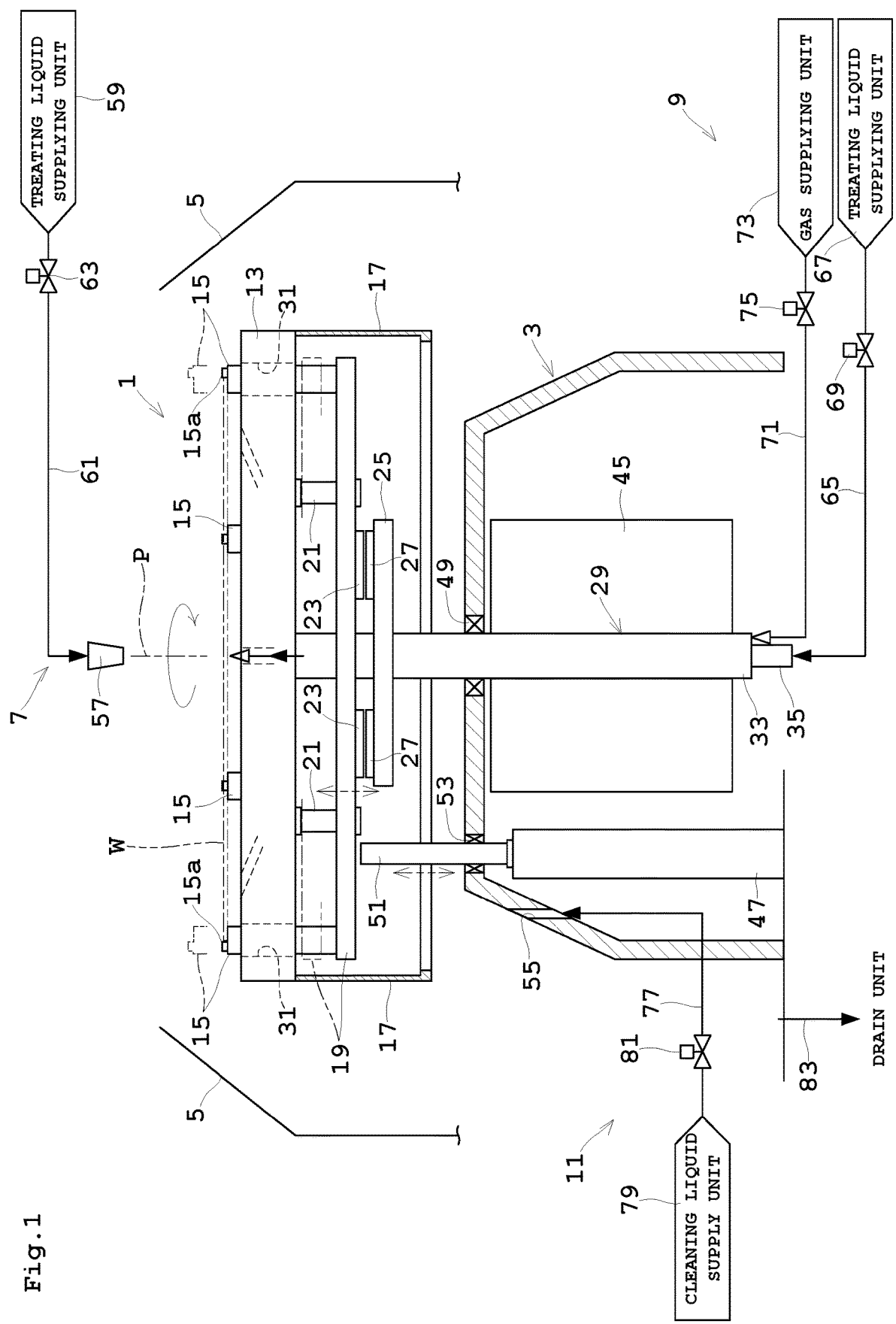
FIG. 1 is an overall diagram showing a schematic configuration of a substrate treating apparatus according to one embodiment.
Figure 2:
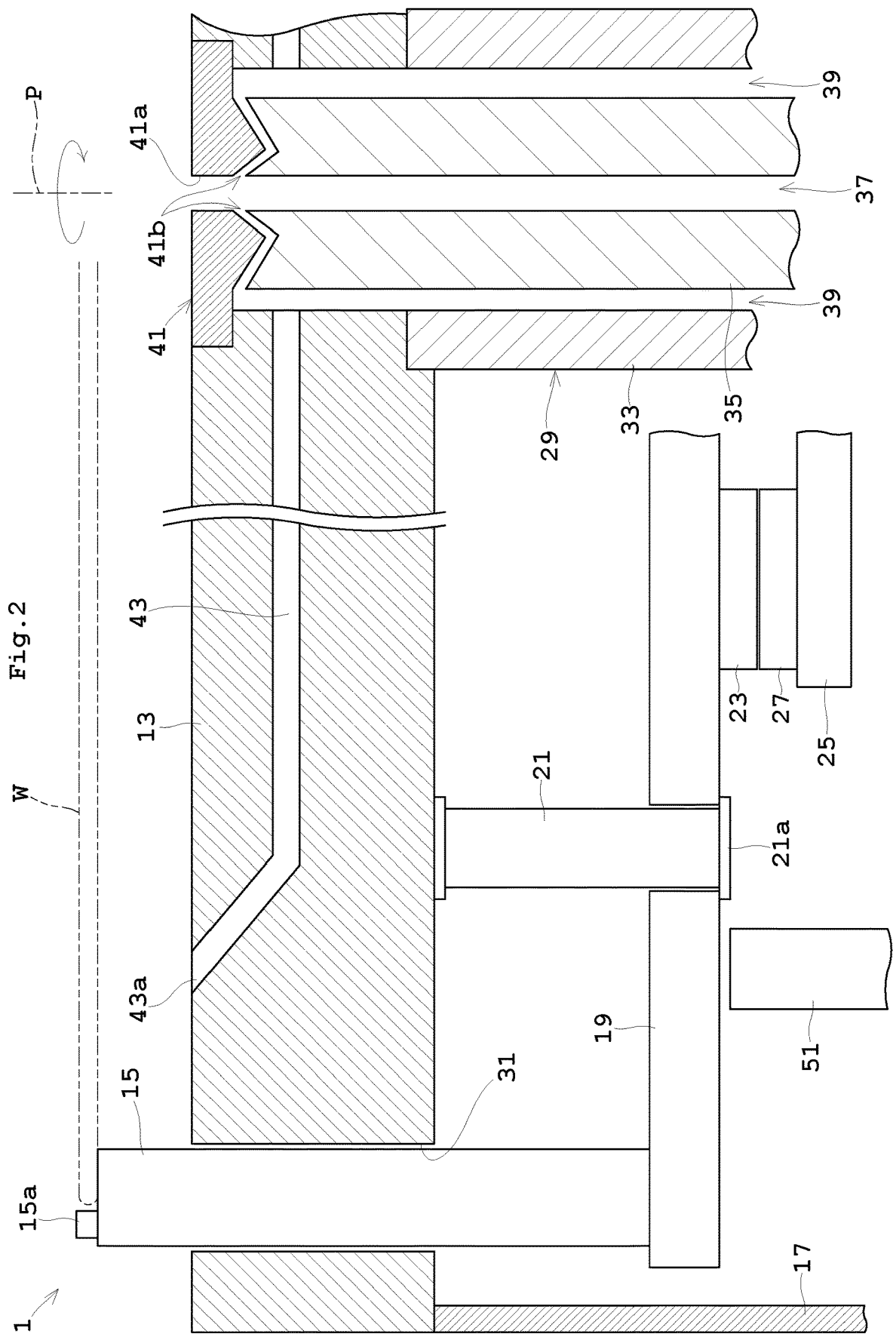
FIG. 2 is a longitudinal sectional view showing a part of a holding unit.

FIG. 1 is an overall diagram showing a schematic configuration of a substrate treating apparatus according to one embodiment. FIG. 2 is a longitudinal sectional view showing a part of a holding unit.

A substrate treating apparatus according to this embodiment performs a treatment with a treating liquid while holding a substrate W in a horizontal posture, for example. The substrate treating apparatus includes a holding unit 1, a cover 3, a scattering prevention cup 5, a treating liquid supply system 7, a lower supply system 9, and a cleaning liquid supply system 11.

A substrate W held by the holding unit 1 to be treated is in a circular shape in plan view, for example. The holding unit 1 includes a rotating member 13, a plurality of (e.g., six) support pins 15, a peripheral surface member 17, a connecting member 19, guide pins 21, upper magnets 23, a magnet holding member 25, lower magnets 27, and a rotary shaft 29.

The rotating member 13 is in a circular shape and has a diameter larger than that of a substrate W. Specifically, the diameter of the rotating member 13 is preferably about 1.05 to 1.2 times of that of a substrate W. The rotating member 13 is rotationally driven by an electric motor 45. The rotating member 13 is surrounded by the scattering prevention cup 5. Accordingly, when the rotating member 13 is too large, the driving force of the electric motor 45 needs to be larger, and thus the scattering prevention cup 5 also needs to be larger in size, leading to increase in cost of the apparatus. The rotating member 13 has a plurality of through-holes 31 formed on an outer peripheral side thereof. The through-holes 31 are in communication with an upper surface and a lower surface of the rotating member 13. The through-holes 31 are formed at a plurality of (e.g., six) positions of the rotating member 13. No sealing member such as an O-ring is interposed in the through-holes 31. In other words, the support pins 15 are inserted in the through-holes 31 with a non-sealing structure. The support pins 15 are each made of a resin material that is resistant to a treating liquid. Examples of the resin material include fluorine-based resins such as polytetrafluoroethylene (PTFE), a copolymer of tetrafluoroethylene and perfluoroalkyl vinyl ether (PFA), and polychlorotrifluoroethylene (PCTFE). Such a resin material is not limited to a fluorine-based resin. Any material that is resistant to the treating liquid supplied from a treating liquid supply system 7, to be mentioned later, may be used. Each support pin 15 is in a cylindrical shape with a longitudinal axis longer than the thickness of the rotating member 13. Each support pin 15 includes a projection 15a on the upper surface thereof for restricting horizontal movement of a substrate W. Each support pin 15 is formed to have an outer diameter slightly smaller than an inner diameter of the through-hole 31.

The support pins 15 each have a lower end portion connected to the connecting member 19. The connecting member 19 is in an annular shape in plan view. The plurality of guide pins 21 are inserted into the connecting member 19 at a part of an area where the support pins 15 are not present in plan view. The upper portions of the guide pins 21 are attached to the lower surface of the rotating member 13, and the lower portions of the guide pins 21 have flanges 21a formed thereon. Consequently, a lowered position of the connecting member 19 is restricted by the flanges 21a of the guide pins 21. The connecting member 19 and the guide pins 21 are made by molding a metallic material such as stainless steel with fluoroplastic described above. Accordingly, the connecting member 19 and the guide pins 21 have a chemical resistance. Moreover, the rotating member 13 is made of a metallic material such as stainless steel. The lower surface and the inner peripheral surface of the rotating member 13 are coated with fluoroplastic or the like described above. Accordingly, the rotating member 13 has a chemical resistance.

The upper magnets 23 are attached to a part of the lower surface of the connecting member 19. The magnet holding member 25 is attached below the connecting member 19, apart from the upper magnets 23. The magnet holding member 25 has a fixed position in level. The lower magnets 27 are attached to the upper surface of the magnet holding member 25. The upper surfaces of the lower magnets 27 face the upper magnets 23. The upper magnets 23 and the lower magnets 27 are attached in such a manner that opposite polarities thereof attracting each other face each other. That is, if a lower surface of an upper magnet 23 has an S pole, the lower magnet 27 is attached in such a manner that an upper surface thereof has an N pole. The upper magnets 23, the lower magnets 27, and the magnet holding member 25 are molded with fluoroplastic described above. Accordingly, the upper magnets 23, the lower magnets 27, and the magnet holding member 25 have a chemical resistance.

The plurality of support pins 15 are moved upward/downward through the connecting member 19, and the support pins 15 are attached to the rotating member 13 with a non-sealing structure. Thus, drive load of the support pins 15 through the connecting member 19 is reduced. Accordingly, the connecting member 19 can be configured to have lower rigidity compared with that of a currently-used connecting member.

A front end portion of the rotary shaft 29 is attached to the rotating member 13. The rotary shaft 29 has a double cylindrical structure. The rotary shaft 29 includes an inner cylinder 35 and an outer cylinder 33 into which the inner cylinder 35 is inserted. An inner peripheral surface of the outer cylinder 33 is spaced apart from an outer peripheral surface of the inner cylinder 35. Accordingly, the rotary shaft 29 includes a first flow path 37 and a second flow path 39 formed therein. The first flow path 37 is provided at the center of the inner cylinder 35. The second flow path 39 is formed by the outer peripheral surface of the inner cylinder 35 and the inner peripheral surface of the outer cylinder 33. An opening lid 41 is attached to the rotation center of the rotating member 13 above the rotary shaft 29. A discharge port 41a is formed at a center of the opening lid 41. A lower portion of the opening lid 41 protrudes downward in a triangular shape. The inner cylinder 35 facing the lower portion has an upper surface recessed downward to form a triangular shape. The triangular shape conforms to the triangular shape of the opening lid 41. These triangular portions are spaced apart from each other, forming a labyrinth structure 41b. The rotary shaft 29 is made by coating fluoroplastic described above to a metallic material such as a stainless-steel alloy. Accordingly, the rotary shaft 29 has a chemical resistance.

A flow path 43 is formed inside the rotating member 13. One end of the flow path 43 is in communication with the second flow path 39. The other end of the flow path 43 is in communication with the upper surface of the rotating member 13 at the peripheral side. The opening at the peripheral side is an edge opening 43a. The edge opening 43a is formed so as to be inclined upward. This causes the edge opening 43a to blow gas toward the upper end portion of the support pin 15 positioned at the level in the support position.

Here, the discharge port 41a and the edge opening 43a described above correspond to the "gas supply mechanism" in the present disclosure.

The rotating member 13 includes the peripheral surface member 17. The peripheral surface member 17 is in an annular shape in plan view. The peripheral surface member 17 extends downward from the outer peripheral surface side of the rotating member 13. A lower end portion of the peripheral surface member 17 is spaced upward from an upper surface of the cover 3. A lower surface of the peripheral surface member 17 has an opening in a substantially circular shape when viewed from below. The peripheral surface member 17 prevents lateral scattering of the treating liquid that entered below the rotating member 13 through the through-holes 31 of the rotating member 13.

Moreover, the lower surface of the peripheral surface member 17 is open. This achieves easy maintenance of the inside of the holding unit 1.

The upper surface of the cover 3 is spaced apart downward from the lower end portion of the peripheral surface member 17. At least the upper surface of the cover 3 is made of, for example, fluoroplastic described above. Accordingly, the cover 3 is resistant to the treating liquid supplied from the treating liquid supply system 7, which is to be mentioned later. The cover 3 includes an electric motor 45 and a lifting/lowering driving unit 47 therein. The rotary shaft 29 is inserted in the central portion of the cover 3 via a sealing member 49. The rotary shaft 29 is connected to the electric motor 45 while protruding downward from a lower end portion of the electric motor 45. When the electric motor 45 is actuated, the rotary shaft 29 is rotated about a shaft axis P. A lifting/lowering driving unit 47 is disposed on an outer peripheral side of the upper surface of the cover 3. The lifting/lowering driving unit 47 is formed by an actuator such as an air cylinder, for example. The lifting/lowering driving unit 47 includes an actuation shaft 51. The actuation shaft 51 has a longitudinal axis oriented vertically. The actuation shaft 51 is inserted into the cover 3 via the sealing member 53. When the lifting/lowering driving unit 47 is actuated, the actuation shaft 51 expands in such a manner that the upper end of the operation shaft 51 is separated from the lifting/lowering driving unit 47. When the lifting/lowering driving unit 47 is in a non-actuated state, the actuation shaft 51 contracts in such a manner that the upper end approaches the lifting/lowering driving unit 47. While the lifting/lowering driving unit 47 is in a non-actuated state, the upper end of the actuation shaft 51 is slightly spaced apart from the lower surface of the connecting member 19. When the lifting/lowering driving unit 47 is in the non-actuated state, the connecting member 19 is movable downward, and the support pins 15 is movable into the support position. Moreover, while the lifting/lowering driving unit 47 is activated, the upper end of the actuation shaft 51 abuts against the lower surface of the connecting member 19 to push the connecting member 19 upward. This causes the actuation shaft 51 to push the support pins 15 upward to the transfer position.

The actuation shaft 51 described above is made of stainless steel, for example. The actuation shaft 51 is coated with fluoroplastic described above, such as polybenzimidazole (PBI), a copolymer of tetrafluoroethylene and ethylene (EFEP). Accordingly, the actuation shaft 51 has a chemical resistance. Moreover, the actuation shaft 51 may be made of polyether ether ketone (PEEK). In this case, the actuation shaft 51 is coated with fluoroplastic or the like described above.

A cleaning nozzle 55 is disposed on a side surface of the cover 3. The side surface is inclined downward from the upper surface of the cover 3. The cleaning nozzle 55 has a longitudinal axis oriented toward an opening of the peripheral surface member 17. The scattering prevention cup 5 is disposed laterally to the cover 3 and the holding unit 1. The scattering prevention cup 5 collects a treating liquid scattered from the holding unit 1 to the periphery thereof. Moreover, the scattering prevention cup 5 collects a treating liquid that has entered inside of the holding unit 1. Moreover, the scattering prevention cup 5 collects the scattered cleaning liquid supplied from the cleaning nozzle 55 to the holding unit 1.

The treating liquid supply system 7 includes a supply nozzle 57, a treating liquid supplying unit 59, a pipe 61, and a control valve 63. The supply nozzle 57 is disposed above the holding unit 1, along the shaft axis P. The supply nozzle 57 is configured to be movable between a standby position (not shown) and a supply position shown in FIG. 1. The treating liquid supplying unit 59 stores a cleaning liquid for cleaning substrates W. Examples of the cleaning liquid include deionized water, a mixed solution of aqueous ammonia and aqueous hydrogen peroxide (SC1), a mixed solution of hydrochloric acid, aqueous hydrogen peroxide, and pure water (SC2), and diluted hydrofluoric acid (DHF). The supply nozzle 57 is in fluid communication with the treating liquid supplying unit 59 via the pipe 61. The control valve 63 is attached to the pipe 61. The control valve 63 regulates a flow rate or permits or shuts off supply of the treating liquid at a predetermined flow rate.

The lower supply system 9 is configured as follows. One end of the pipe 65 is in fluid communication with the first flow path 37 of the rotary shaft 29. The other end of the pipe 65 is in fluid communication with a treating liquid supplying unit 67. The pipe 65 includes a control valve 69. The control valve 69 adjusts the flow rate of the treating liquid or controls the supply/shut-off of the treating liquid. The treating liquid supplying unit 67 is capable of supplying a treating liquid similar to that supplied by the treating liquid supplying unit 59 described above, for example. Moreover, one end of a pipe 71 is in fluid communication with the second flow path 39 of the rotary shaft 29. The other end of the pipe 71 is in fluid communication with a gas supplying unit 73. The pipe 71 includes a control valve 69. The control valve 69 adjusts a flow rate of gas or controls supply/shut-off of gas. The gas supplying unit 73 supplies gas. The gas is preferably an inert gas, and a nitrogen gas is suitable, for example. The control valves 69 and 75 may be opened simultaneously. In this case, a treating liquid and gas is supplied from the discharge port 41a toward a lower surface of a substrate W at the same time. Moreover, in this case, only gas is supplied from the edge opening 43a toward a peripheral edge of the lower surface of the substrate W.

Moreover, the rotary shaft 29 employs the labyrinth structure 41b. Accordingly, the treating liquid does not enter the second flow path 39 after the treating liquid is supplied from the discharge port 41a. Consequently, even in the case where only gas is supplied from the discharge port 41a, no treating liquid previously supplied is supplied from the discharge 41a to a substrate W. As a result, an appropriate fluid supply is achievable.

One end of a pipe 77 is in fluid communication with the cleaning nozzle 55 of the cleaning liquid supply system 11. The other end of the pipe 77 is in fluid communication with a cleaning liquid supply unit 79. A control valve 81 is attached to the pipe 77. The control valve 81 adjusts a flow rate of the cleaning liquid, or controls the supply/shut-off of the cleaning liquid. The cleaning liquid supply unit 79 supplies, for example, deionized water or the like as the cleaning liquid.

The substrate treating apparatus includes, for example, a drain pipe 83 at the bottom thereof. The drain pipe 83 is in fluid communication with a drain unit provided in a clean room or the like. The drain pipe 83 discharges a treating liquid supplied from the treating liquid supply system 7, the lower supply system 9, the cleaning liquid supply system 11, and the like.

Figure 3:
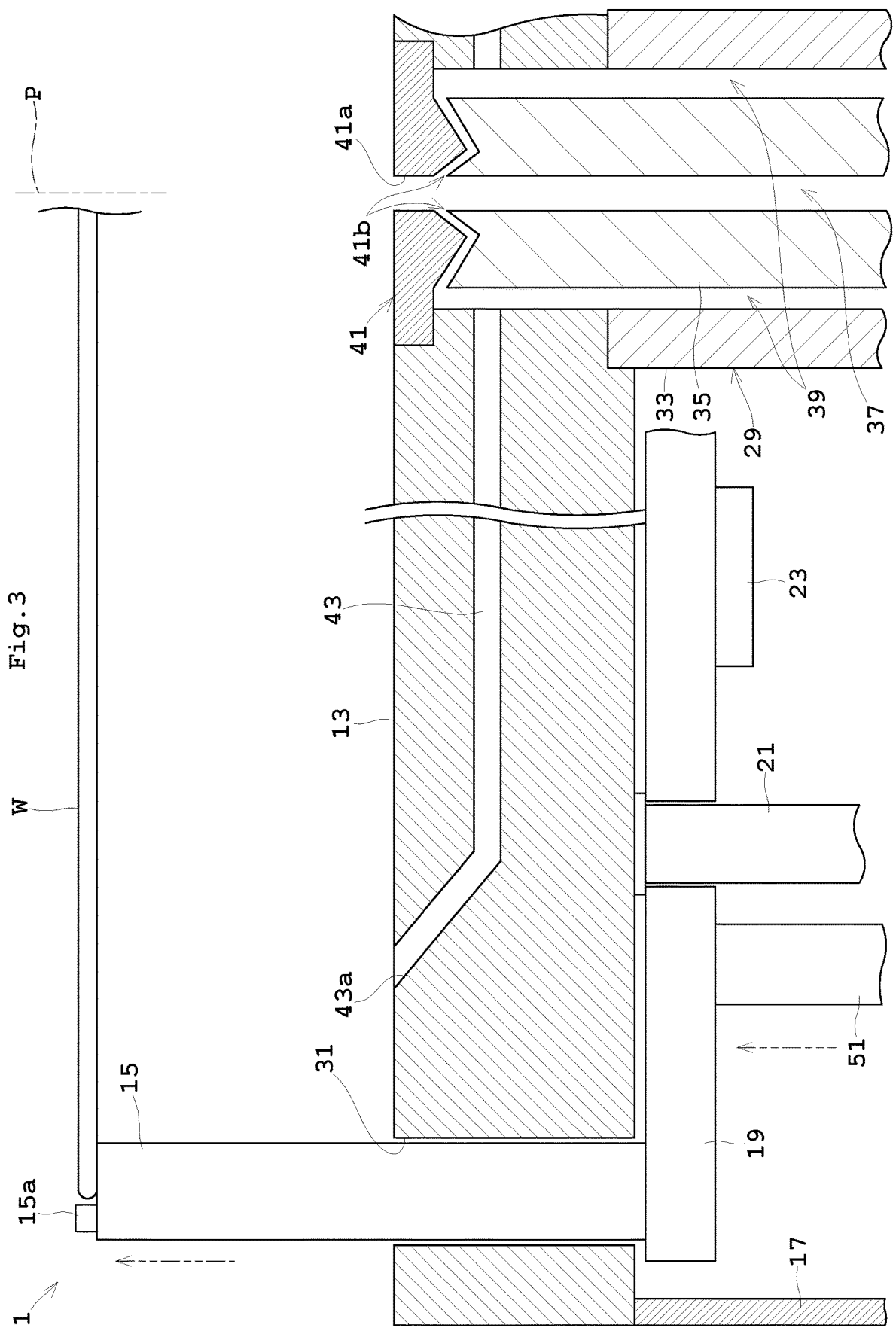
FIG. 3 is a longitudinal sectional view showing the part of the holding unit in a state where a support pin is in a transfer position.
Figure 4:
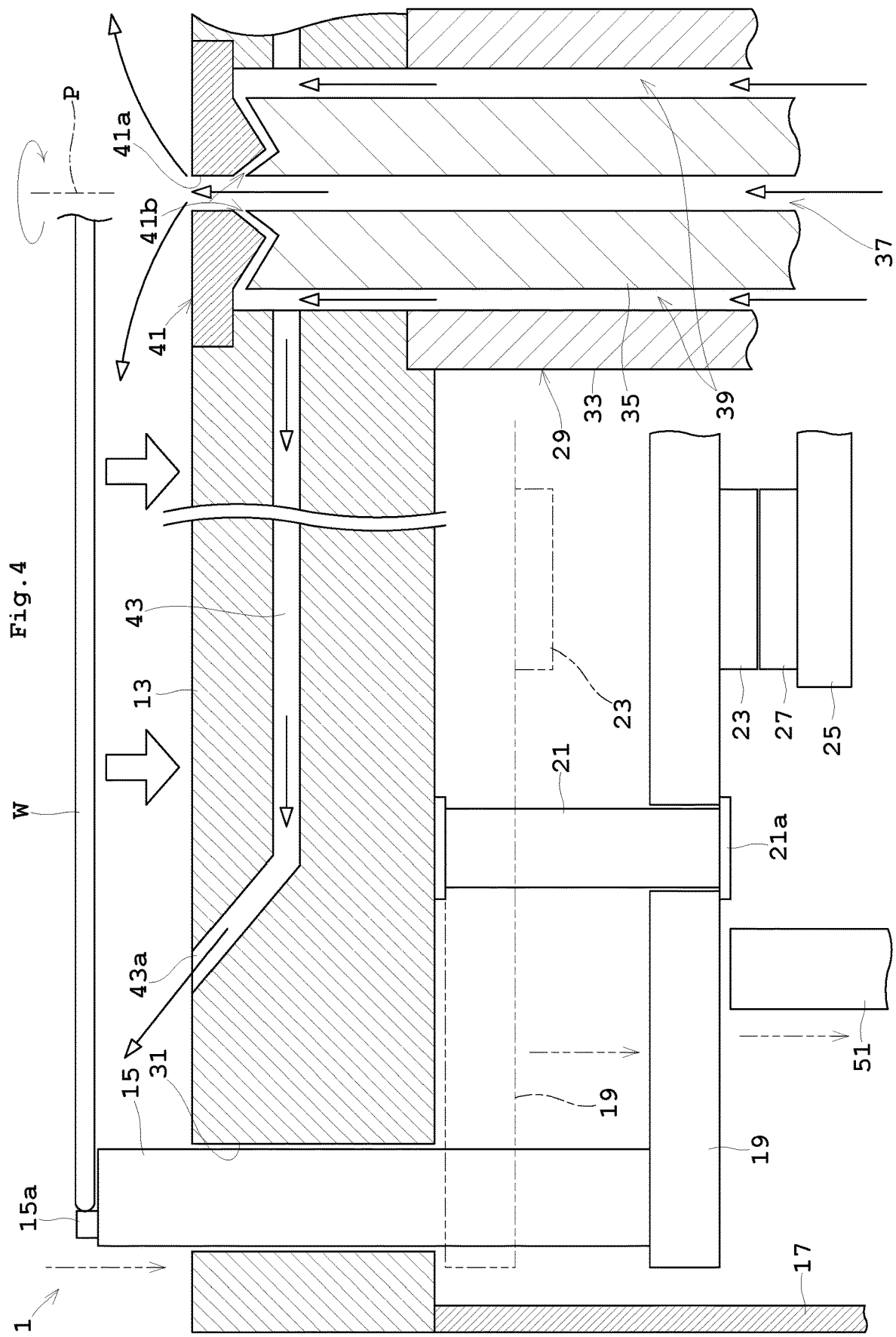
FIG. 4 is a longitudinal sectional view showing the part of the holding unit in a state where the support pin is rotated in a support position.
Figure 5:
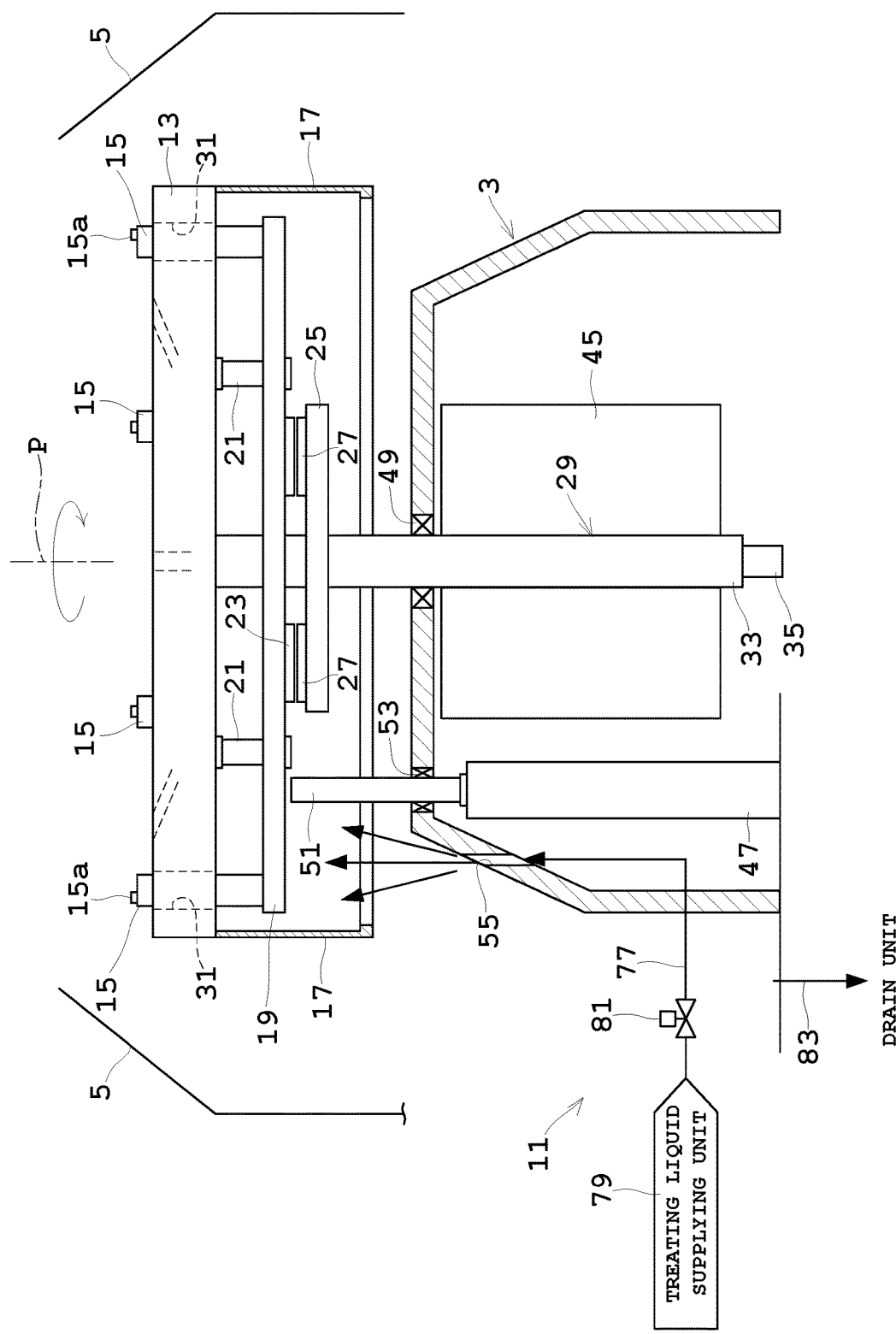
FIG. 5 is a diagram showing a state where the inside of the holding unit is being washed.

Reference is now made to FIGS. 3 and 4. FIG. 3 is a longitudinal sectional view showing the part of the holding unit in a state where a support pin is in a transfer position. FIG. 4 is a longitudinal sectional view showing the part of the holding unit in a state where the support pin is rotated in a support position.

When a substrate W to be treated is received from a transport mechanism (not shown), the lifting/lowering driving unit 47 is activated. This causes the actuation shaft 51 to raise as shown in FIG. 3, thereby pushing the connecting member 19 upward to move the support pins 15 upward to the transfer position. The support pins 15 each have an extremely smaller sliding resistance at the time of upward movement in comparison with the currently-used support pins since there is no sealing member such as a currently-used O-ring. Consequently, a drive load at the upward movement of the support pins 15 is just the sum of a force to raise the support pins 15 and the connecting member 19 and the like, and a force to release an attraction force due to the magnetic force of the magnets 23 and 27. However, such drive load is extremely smaller compared with that of a conventional configuration with a sealing member such as an O-ring. Thus, in a state where the support pins 15 are moved upward to the transfer position, a substrate W is transferred from a transport mechanism (not shown) and is placed on the support pins 15. At this time, an edge of the substrate W in the horizontal position is restricted by the projections 15a.

The lifting/lowering driving unit 47 is then in a non-actuated state. Accordingly, the actuation shaft 51 is contracted toward the lifting/lowering driving unit 47. Then, as shown in FIG. 4, the upper end of the actuation shaft 51 pushing the lower surface of the connecting member 19 upward is spaced apart downward from the lower surface of the connecting member 19. Accordingly, the support pins 15 start to move downward by their own weights combined with those of the connecting member 19 and the magnets 23, or the like. At the same time, the support pins 15 are rapidly lowered by attraction due to the magnetic force between the upper magnets 23 and the lower magnets 27. Such lowering is stopped when the connecting member 19 reaches the flange 21a of the guide pin 21. This causes a part of the support pins 15 to enter the upper surface of the rotating member 13, and to move the lower surface of the substrate W to the support position close to the upper surface of the rotating member 13. Since the connecting member 19 is attracted downward by the upper magnets 23 and the lower magnets 27, the support pins 15 can be moved quickly from the transfer position to the support position.

At this time, a centering pin (not shown) provided in the rotating member 13 may perform centering operation to match a center of a substrate W to a rotation center of the rotating member 13. Here, for easy understanding of the invention, it is assumed that a substrate W and the rotating member 13 are placed in such a manner that the center of substrate W and the center of the rotating member 13 are substantially coincident.

When the substrate W is moved to the support position, the control valve 75 is opened. Then, as indicated by a white triangle arrow line in FIG. 4, a nitrogen gas is discharged from the discharge port 41a and the edge opening 43a. The nitrogen gas discharged from the discharge port 41a is oriented laterally at a lower surface of the substrate W. Then, the nitrogen gas flows out at a high speed toward the outer periphery of the substrate W through a narrow space between the upper surface of the rotating table 13 and the lower surface of the substrate W. Moreover, the nitrogen gas discharged from the edge opening 43a is oriented laterally at the outer peripheral edge of the lower surface of substrate W. Then, the nitrogen gas flows out at a high speed through a narrow space between the rotating table 13 and the outer peripheral edge of the lower surface of the substrate W. Such flow of the nitrogen-gas produces a Bernoulli effect, generating a negative pressure on the lower surface of the substrate W. The negative pressure generates a suction force toward the upper surface of the rotating member 13 with respect to the substrate W, and the substrate W is sucked toward the rotating member 13. Consequently, the substrate W can be held stably by the holding unit 1.

After the substrate W is sucked toward the rotating member 13, the electric motor 45 is operated to start to rotate the rotary shaft 29 to a cleaning rotation rate. After the rotation rate of substrate W reaches the cleaning rotation rate, the supply nozzle 57 is moved above the shaft axis P. At the same time, the control valve 63 is opened. Then, the treating liquid is supplied from the supply nozzle 57 toward the upper surface of the substrate W, and the treating liquid flows out toward the outer peripheral surface at the upper surface of the substrate W by a centrifugal force. This cleans the upper surface of the substrate W with the treating liquid. When a predetermined treatment time elapses, the control valve 63 is closed to stop the supply of the treating liquid from the supply nozzle 57. Then, the rotation rate of the electric motor 45 is increased to a drying rotation rate higher than the cleaning rotation rate. Accordingly, the treating liquid adhering to the substrate W or the rotating table 13 or the like is scattered around, and a drying process is performed on the substrate W. The treating liquid scattered around is collected into the scattering prevention cup 5. After the drying process for a predetermined time, the electric motor 45 is stopped.

When the drying process is completed, the control valve 75 is closed to stop the supply of the nitrogen gas. This eliminates the negative pressure generated on the lower surface of the substrate W. Then, when the lifting/lowering driving unit 47 is actuated, the actuation shaft 51 is moved upward as shown in FIG. 3, thereby pushing the connecting member 19 upward to move the support pins 15 upward to the transfer position. Then, the transport mechanism (not shown) transfers the cleaned substrate W from the support pins 15.

Moreover, while repeatedly performing the cleaning process described above, the treating liquid flows down through the gaps between the support pins 15 and the through-hole 31. The treating liquid flowing downward from the rotating member 13 and the peripheral surface member 17 is discharged to the drain unit through the drain pipe 83 in a lower portion of the substrate treating apparatus. The treating liquid that not discharged from the drain pipe 83 adheres to the components in the space surrounded by the rotating member 13 and the peripheral surface member 17. Then, as illustrated in FIG. 2, the control valve 81 is opened to supply the cleaning liquid from the cleaning nozzle 55 while the electric motor 45 rotates periodically. Accordingly, the cleaning liquid is sprayed on the components in the space surrounded by the rotating member 13 and the peripheral surface member 17, and the treating liquid also flows down on the upper surface of the cover 3. Thus, the treating liquid is removable that adheres to the components of the space surrounded by the rotating member 13 and the peripheral surface member 17, and the upper surface of the cover 3 is removable. Consequently, such a situation is preventable in advance that the adhering treating liquid is stuck and dried, and then is peeled off to become particles, thereby contaminating a substrate W.

With this embodiment, the support pins 15 are attached to the through-holes 31 of the rotating member 13 with a non-sealing structure. Accordingly, the treating liquid supplied from the supply nozzle 57 enters the lower surface of the rotation member 13 through the gaps between the through-holes 31 of the rotating member 13 and the support pins 15. However, the electric motor 45 and the lifting/lowering driving unit 47 are covered with the cover 3, leading to prevention of adverse effects by the treating liquid. Moreover, since the non-sealing structure is adopted, lowered sliding resistance and drive load can be obtained. Consequently, the lifting/lowering driving unit 47 does not need to increase the driving force and rigidity of the member for driving, leading to a reduction in cost of the substrate treating apparatus.

The present invention is not limited to the foregoing examples, but may be modified as follows.

(1) In the embodiment described above, a target to be treated is only a substrate W. However, the present invention is also applicable to a substrate treating apparatus for treating a substrate W thinned by grinding only the inside of its inner circumference without grinding its edge portion (for several millimeters) at the outermost periphery (also referred to as a TAIKO substrate), or a substrate W thinned over the entire surface, for example.

(2) In the embodiment described above, such a substrate treating apparatus has been described as an example that includes only the support pins 15 in the rotating member 13. However, the present invention is also applicable to the substrate treating apparatus that includes a centering pin between the support pins 15 described above, for example. Specifically, a substrate treating apparatus with a centering mechanism is exemplified. The centering mechanism pivots the centering pin. The centering mechanism pivots the centering pin while a substrate W is supported on the support pins 15 and is moved to the support position. Then, the rotation center of the substrate W is matched with the rotation center of the rotating member 13. The centering pin is pivotally attached to the rotating member 13 be pivoted around the vertical axis, and includes an alignment projection in a position decentered from the vertical axis. In this case, magnets are attached to the lower end portion of the centering pin in such a manner that magnetic poles of the magnets are different horizontally. Moreover, a centering pin driving unit for switching the polarity of the magnets is disposed inside the cover 3. When the centering pin driving unit is actuated, a magnetic force caused by switching the magnetic poles affects the magnets at the lower end portion of the centering pin over the upper surface of the cover 3. Consequently, the centering pin rotates around its vertical axis. It is preferred that the centering pin has such a configuration as to be coated with an above-described fluoroplastic, and to be rotatable with a non-sealing structure.

(3) In the embodiment described above, the connecting member 19 drives to lift and lower the support pins 15 collectively. However, the present invention is not limitative to this configuration. For example, such a configuration may be employed that six support pins 15 are divided into two groups, and the separated groups of three support pins 15 are driven to move up or down collectively.

(4) The embodiment described above employs the configuration in which the actuation shaft 51 is not connected to the connecting member 19. However, the present invention is not limitative to this configuration. For example, such a configuration may be employed in which the upper end of the actuation shaft 51 is connected to the lower surface of the connecting member 19. In this case, the upper magnets 23, the lower magnets 27, and the magnet holding member 25 can be omitted, leading to a reduction in cost.

(5) In the embodiment described above, the cover 3 includes the cleaning nozzle 55. However, this configuration is not essential in the present invention. Moreover, instead of providing the cleaning nozzle 55 to the cover 3 itself, the cleaning nozzle 55 may be disposed at a position where the cleaning liquid can be supplied to the inside of the peripheral surface member 17. For example, the cleaning nozzle 55 may be disposed at a position inside the scattering prevention cup 5 and outside the cover 3.

(6) In the embodiment described above, a negative pressure is generated by ejecting gas at the high speed into the gap between the lower surface of the substrate W supported by the support pins 15 and the surface of the rotating member 13, thereby generating a suction force on the substrate W toward the rotating member 13. However, the present invention is not limited to such a Bernoulli chuck. Specifically, the present invention is applicable to a substrate treating apparatus including a holding unit for abutting against to support an outer peripheral edge of a lower surface of a substrate W simply by the support pins 15.

The present invention may be embodied in other specific forms without departing from the spirit or essential attributes thereof and, accordingly, reference should be made to the appended claims, rather than to the foregoing specification, as indicating the scope of the invention.

What is claimed is:

1. A substrate treating apparatus for treating a substrate with a treating liquid, the apparatus comprising:
   a rotating member resistant to the treating liquid, having a diameter larger than a diameter of the substrate, and including a plurality of through-holes formed therein and configured to be in communication with an upper surface and a lower surface of the rotating member on an outer peripheral side;
   a plurality of support pins resistant to the treating liquid, attached to the through-holes with a non-sealing structure, and configured to support the substrate in such a manner that a lower surface of the substrate is spaced apart from the upper surface of the rotating member,
   a supply nozzle configured to supply a treating liquid to the substrate supported by the support pins on the upper surface of the rotating member,
   a cover resistant to the treating liquid and spaced apart below from the lower surface of the rotating member;
   a rotational drive device disposed within the cover and configured to drive the rotating member rotationally in a horizontal plane; and
   a drive device disposed within the cover and configured to drive the support pins, wherein
   some of the support pins work as lifting pins,
   the substrate treating apparatus includes a connecting member configured to connect the lifting pins below the rotating member,
   the drive device drives to lift and lower the lifting pins via the connecting member between a transfer position where the substrate is transported and a support position lower than the transfer position,
   the drive device includes an actuation shaft configured to move forward and backward, an upper end of the actuation shaft abuts against the connecting member when the connecting member moves to the transfer position, the upper end of the actuation shaft is spaced apart from the connecting member when the connecting member moves to the support position, and
   the substrate treating apparatus includes magnets for attracting the connecting member downward with a magnetic force thereof when the connecting member moves from the transfer position to the support position.

2. The substrate treating apparatus according to claim 1, wherein:
   the rotating member includes a peripheral surface member extending downward from an outer peripheral surface of the rotating member, and including a lower end portion spaced apart upwardly from an upper surface of the cover, and an opened lower surface.

3. The substrate treating apparatus according to claim 2, further comprising:
   a cleaning nozzle configured to supply a cleaning liquid toward an inside of the peripheral surface member.

4. The substrate treating apparatus according to claim 1, further comprising:
   a gas supply mechanism configured to supply gas between the rotation member and a lower surface of the substrate supported by the support pins,
   wherein a suction force is generated on the substrate supported by the support pins toward the rotating member.

5. The substrate treating apparatus according to claim 2, further comprising:
   a gas supply mechanism configured to supply gas between the rotation member and a lower surface of the substrate supported by the support pins,
   wherein a suction force is generated on the substrate supported by the support pins toward the rotating member.

6. The substrate treating apparatus according to claim 3, further comprising:
   a gas supply mechanism configured to supply gas between the rotation member and a lower surface of the substrate supported by the support pins,
   wherein a suction force is generated on the substrate supported by the support pins toward the rotating member.

7. The substrate treating apparatus according to claim 1, wherein:
   the plurality of support pins are inserted into the plurality of through-holes.

8. The substrate treating apparatus according to claim 1, wherein:
   the cover has an upper surface, and a side surface inclined downwardly from the upper surface.

* * * * *